United States Patent [19]

Samachisa et al.

[11] Patent Number: 4,783,766
[45] Date of Patent: Nov. 8, 1988

[54] BLOCK ELECTRICALLY ERASABLE EEPROM

[75] Inventors: Gheorghe Samachisa; George Smarandoiu; Chien-Sheng Su, all of San Jose; Ting-Wah Wong, Cupertino, all of Calif.

[73] Assignee: SEEQ Technology, Inc., San Jose, Calif.

[21] Appl. No.: 869,207

[22] Filed: May 30, 1986

[51] Int. Cl.⁴ .............................................. G11C 11/34
[52] U.S. Cl. .................................. 365/185; 357/23.5; 365/218
[58] Field of Search ............... 365/184, 185, 189, 218; 29/571; 357/23.5

[56] References Cited

U.S. PATENT DOCUMENTS

| 4,203,158 | 5/1980 | Frohman-Bentchkowsky et al. | 365/185 |
| 4,328,565 | 5/1982 | Harari | 365/185 |
| 4,409,723 | 10/1983 | Harari | 357/23.5 |
| 4,412,311 | 10/1983 | Miccoli et al. | 365/185 X |

FOREIGN PATENT DOCUMENTS 2073488  10/1981  United Kingdom ............... 365/185

OTHER PUBLICATIONS

Microchip, A Practical Guide to Semiconductor Processing, by Peter Van Zant, 1986, p. 249.
Frohman-Bentchkowsky, "Famos—A New Semiconductor Charge Storage Device," pp. 517-529 (1973).
Kooi, et al., "Formation of Silicon Nitride At A Si--SiO2 Interface During Local Oxidation of Silicon and During Heat-Treatment of Oxidized Silicon in NH3 GAS," pp. 1117-1120 (Jul. 1976).
Guterman, et al, "An Electrically Alterable Nonvolatile Memory Cell Using a Floating Gate Structure," pp. 498-508 (Apr. 1979).
Masuoka, et al., "A New Flash Ez Prom Cell Using Triple Polysilicon Technology," pp. 464-467 (1984).
Mukherjee, et al., "A Single Transistor EEPROM Cell and its Implementation in a 512K CMOS EEPROM," pp. 616-619 (1985).

Primary Examiner—Stuart N. Hecker
Assistant Examiner—Alfonso Garcia
Attorney, Agent, or Firm—Lyon & Lyon

[57] ABSTRACT

An electrically programmable, electrically erasable semiconductor memory apparatus for storing information in which the equivalent of a floating gate memory device and a select transistor device are combined in a single device cell is disclosed. A single control gate both controls a select transistor and is used in programming the floating gate.

7 Claims, 1 Drawing Sheet

BLOCK ELECTRICALLY ERASABLE EEPROM

FIELD OF THE INVENTION

The present invention relates to semiconductor memories and is more particularly directed to a block erasable EEPROM semiconductor memory.

BACKGROUND OF THE INVENTION

EPROMs (Electrically Programmable Read Only Memories) are widely used in electronic applications in which low cost, non-volatile memories are desired. Among their many advantages, is their usefulness in applications in which it is desired to have a non-volatile memory capable of being programmed for a specific application, while retaining the flexibility of being able to erase and reprogram that memory.

When it is desired to erase the prior art EPROM, the EPROM is removed from the circuit in which it is employed and then placed in a special erasing apparatus. In this erasing apparatus, the EPROM is exposed to ultraviolet light. The ultraviolet light causes the EPROM to then erase. Once the EPROM is exposed to ultraviolet light in the erasing apparatus, the erase process takes approximately 15-20 minutes in the prior art EPROM. Also, ultraviolet erasable EPROMs must generally be packaged in special, costly ceramic packages containing quartz windows in order for it to be possible to expose the EPROM to ultraviolet light during erasure.

The main disadvantage in using EPROMs is the lack of system flexibility due to the necessity of removing the EPROM from the circuit board in which it is used in order to erase the EPROM. The disadvantage does not exist when EEPROMs (Electrically Erasable Programmable Read Only Memories) are used in place of EPROMs. EEPROMs can be programmed and erased on board, that is, while still in a circuit board. Because of this on-board erasing flexibility, EEPROMs are replacing EPROMs in many applications. However, prior art EEPROMs are much more costly to manufacture than EPROMs. This cost differential between prior art EEPROMs and prior art EPROMs is, for the most part, because the prior art EEPROM cell size is much larger than the EPROM cell size.

A relatively small cell size is typically achieved in prior art ultraviolet erasable EPROMs because these EPROMs use a single transistor per cell. This single transistor cell structure is possible because these EPROMs use hot electron injection mechanisms to program the cells. The EPROM cell is programmed only when both the drain and gate of the cell are raised to a high voltage. Normally, the word line is called the X address and the bit line is called the Y address. This X-Y addressing mode during programming of the cell in an array eliminates the need for byte-select transistors.

Prior art EEPROMs, on the other hand, use Fowler-Nordheim tunneling to program the cells. These prior art EEPROMs require a byte select transistor, as is well known in the art, and the EEPROM requires two transistors per cell. Additionally, as is well known in the art, a tunneling area is needed in each such EEPROM cell. Hence, the prior art EEPROM cell is much larger than the prior art EPROM cell.

Several attempts to overcome the disadvantages of ultraviolet erasable EPROMs have been made. Thus, erasing the EPROMs by tunneling electrons from the floating gate to the control gate through the interpoly oxide has been attempted. Such an attempt is discussed in Guterman, et al., "An Electrically Alterable Nonvolatile Memory Cell Using a Floating-Gate Structure," IEEE J. SOLID-STATE CIRCUITS, SC-14 p. 498 (April 1979). However, due to the incompatibility between erasability and programming speed, the structure was not successful.

Also, a triple-polysilicon technology employing an erase electrode located between the field oxide and the floating gate has been attempted, as is discussed in Masuoka, et al., "A New Flash E2PROM Cell Using Triple Polysilicon Technology," International Electron Devices Meeting Technical Digest p. 464 (1984). In this technology, the floating gate is erased by Fowler-Nordheim tunneling.

Further, a double polysilicon technology using Fowler-Nordheim tunneling through the dielectric between the floating gate and the drain or source to erase the cells has been attempted, as discussed in Mukherjee, et al., "A Single Transistor EEPROM Cell and its Implementation in a 512K CMOS EEPROM," International Electron Devices Meeting Technical Digest p. 616 (1985). However, all of these attempts to solve the problems inherent in an ultraviolet erasable EPROM share additional problems arising from the overerase of the floating gate that results when these methods to erase an EPROM cell are employed.

When an ultraviolet erasable EPROM is erased, the floating gate is electrically neutral. This is because the ultraviolet light causes "programming" electrons to leave the floating gate, but does not cause the floating gate to acquire a positive charge by causing additional electrons to leave the floating gate. When an EEPROM is erased electrically, through Fowler-Nordheim tunneling or tunneling through the interpoly oxide, the floating gate acquires a positive charge. The result of this positive charge on the floating gate is that the transistor acts like a depletion transistor and therefore leaks current. Hence, false data reads or failures to program can result. It is desired to overcome the problems caused by this overerase phenomenon.

Endurance is another factor in determining whether to employ a prior art EPROM or a prior art EEPROM in a particular application. Endurance is a measure of the number of times that a cell can be erased and rewritten. A part with a high endurance can be erased and rewritten many times, while a part with a low endurance can be erased and rewritten relatively fewer times. Prior art EEPROMs typically have a higher endurance than prior art EPROMs. Thus, although prior art EEPROMs are, typically, more expensive than prior art EPROMS, in applications in which a relatively high endurance and a fast erase are desired, prior art EEPROMs are often used instead of prior art EPROMs.

OBJECTS AND ADVANTAGES

The present invention is directed to an EEPROM with a small cell size that can be erased much more quickly than the typical prior art EPROM. The present invention is further directed to an EEPROM with a relatively high endurance.

It is an object of the present invention to provide an EEPROM that is bulk-erasable.

It is a further object of the present invention to provice an EEPROM that has a relatively small cell size. Other and further objects and advantages will appear hereinafter.

SUMMARY OF THE INVENTION

The equivalent of a floating gate transistor and a select transistor are combined in a single device. A single control gate is used for both the floating gate transistor and the select transistor.

A grounding means for grounding and floating the select transistor for purposes of programming and erasing the cell is further disclosed.

DETAILED DESCRIPTION OF THE PREFERRED EMBODIMENT

A presently preferred embodiment of the present invention is disclosed. It will be understood by one skilled in the art that other embodiments of the present invention are also possible and are meant to be included within the scope of the appended claims.

Figure 1:
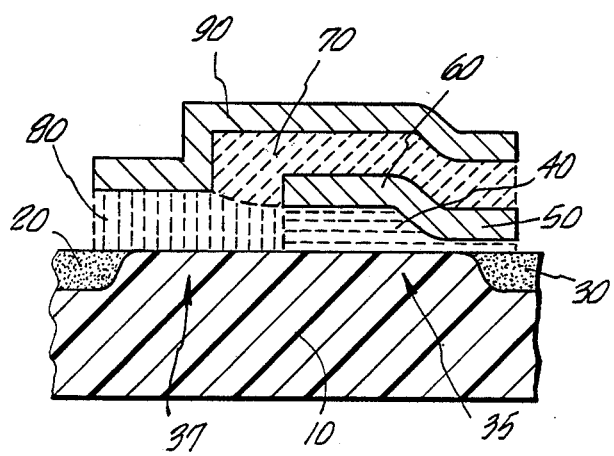
FIG. 1 shows a cross-section of an EEPROM cell according to a preferred embodiment of the present invention.

Referring now to FIG. 1, there is shown a slice (not to scale) through an EEPROM memory cell comprising various layers grown and/or deposited on P-type monocrystalline silicon substrate 10. Thus, as a preliminary step, a field oxide region (not shown in the drawings) is grown to a thickness of approximately 10,000 Angstroms over P-type monocrystalline substrate 10, as is well known in the art. Next, first gate oxide region 40 is grown to approximately 250 Angstroms above P-type monocrystalline substrate 10. Then, a first polysilicon layer is deposited over first oxide region 40 to a thickness of approximately 3,000 Angstroms. Next, the first polysilicon layer is lightly doped. Floating gate 60 is then defined from that first polysilicon layer, using masking and etching techniques, as is well-known in the art. After defining floating gate 60, interpoly oxide 70 and second gate oxide region 80 are grown at the same time, as is well known in the art. Interpoly oxide 70 is grown to approximately 800–850 Angstroms and second gate oxide region 80 is grown to approximately 600 Angstroms. Next, a second polysilicon layer is deposited to a thickness of approximately 4,500 Angstroms over interpoly oxide 70 and second gate oxide region 80, and then doped. Control gate 90 is then defined from that second polysilicon layer by masking and etching techniques, as is well known in the art. Finally, as is well known in the art, source region 20 and drain region 30 resulting is a self-aligned gate and source-drain structure. Those of ordinary skill in the art will recognize that this process sequence results in a structure in which the source and drain are "self-aligned" with respect to the gate edges, and that only a small side diffusion of source and drain under the gates will exist.

First gate oxide region 40 covers the portion of the region of P-type monocrystalline silicon substrate 10 which lies below the floating gate 60. First gate oxide region 40 further overlaps the very small portion of drain region 30 below floating Gate 60 formed as a result of the lateral diffusion of self-aligned drain region 30. First gate oxide region 40 may be a layer of silicon dioxide (SiO2).

First gate oxide region 40 further comprises thin dielectric region 50. By using the well-known Kooi effect, when first gate oxide region 40 is formed, the portion of first gate oxide region 40 that is labeled as thin dielectric region 50 grows at a slower rate than the remainder of first gate oxide region 40 and thus is thinner than the remainder of first gate oxide region 40. In one embodiment of the present invention, thin dielectric region 50 forms the portion of first gate oxide region 40 that overlaps drain region 30, and thin dielectric region 50 may further extend into the region above P-type monocrystalline silicon substrate 10 that lies between drain region 30 and source region 20. While thin dielectric region 50 may be grown by using any one of the known methods of forming a thin dielectric region, in the presently preferred embodiment of the present invention, thin dielectric region 50 is grown using the well-known Kooi effect, as is disclosed in Kooi, et al., "Formation of Silicon Nitride at a Si-SiO2 Interface During Local Oxidation of Silicon and During Heat-Treatment of Oxidized Silicon in NH3 Gas," 123 J. Electrochemical Soc'y 1117 (July 1976).

First channel region 35 is the portion of the device channel that lies below floating gate 60 and abuts drain region 30. Under conditions discussed below, a conductive channel for charge carriers is formed in first channel region 35. Second channel region 37 is the portion of the device channel that lies below control gate 90 and abuts source region 20, but does not extend below floating gate 60. Under conditions discussed below, a conductive channel for charge carriers is formed in second channel region 37. Both first channel region 35 and second channel region 37 are simultaneously formed with P-type threshold adjusting implants as is well-known in the art.

First gate oxide region 40 forms a dielectric layer between first channel 35 and floating gate 60. First gate oxide region 40 further forms a dielectric region between the small laterally diffused portion of drain region 30 that lies below floating gate 60 and floating gate 60.

Floating gate 60 is grown over first gate oxide region 40 and extends above the laterally-diffused portion of drain region 30 approximately 0.2 to 0.3 microns and further extends above a portion of the region of P-type monocrystalline substrate 10 that adjoins drain region 30. Floating gate 60 is comprised of a layer of a phosphorus-doped polysilicon that is used to store charge in programming the EEPROM memory cell, as discussed below.

Interpoly oxide region 70 is grown over floating gate 60. Interpoly oxide region 70 may be comprised of an oxide, or other equivalent dielectric as is well known in the art.

Second gate oxide region 80 is grown over P-type monocrystalline silicon substrate 10 and covers the portion of P-type monocrystalline silicon substrate 10 which lies above channel 37. Second gate oxide region 80 further overlaps the laterally-diffused portion of source region 20 that lies below control gate 90. As mentioned, interpoly oxide region 70 and second gate oxide region 80 may be simultaneously grown.

Control gate 90 is formed over second gate oxide region 80 and interpoly oxide 70 to extend from drain region 30 to source region 20. Control gate 90 overlaps both drain region 30 and source region 20 by approximately 0.2 to 0.3 microns. Control gate 90 is comprised of a layer formed of a phosphorus-doped polysilicon as is well known in the art. Control gate 90 is more heavily doped than floating gate 60.

It will be obvious to one skilled in the art that control gate 90, as far as it overlaps floating gate 60, forms the control gate of a floating gate device, and further that control gate 90, as it extends beyond floating gate 60 over a portion of source region 20 further forms the control gate of a select transistor device. The function of the select transistor portion of the EEPROM memory cell is discussed below.

Figure 2:
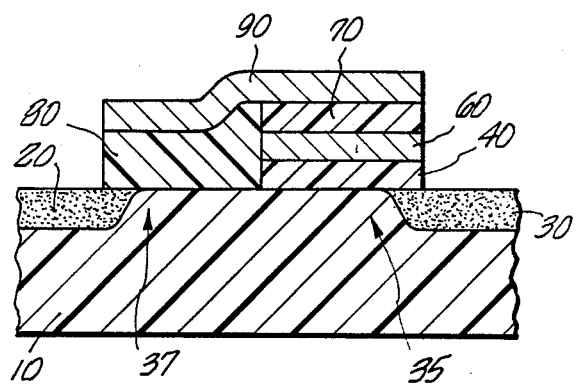
FIG. 2 shows a cross-section of an EEPROM cell according to a second embodiment of the present invention.

FIG. 2 shows a second embodiment of the present invention. In this second embodiment, first gate oxide region 40 is grown to a uniform thickness below floating gate 60. In this embodiment, masking, etching and oxide growing techniques well known in the art are used to form uniformly thin first gate oxide region 40.

Figure 3:
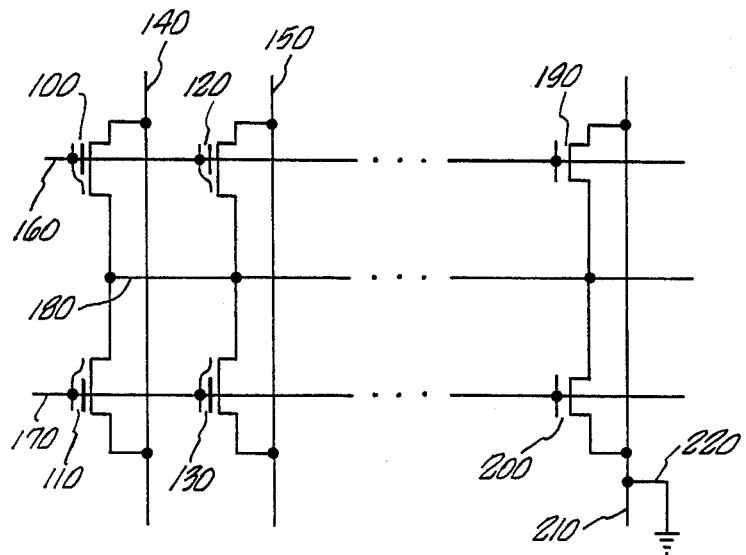
FIG. 3 shows a portion of an EEPROM cell array according to a preferred embodiment of the present invention.

FIG. 3 shows a portion of an EEPROM memory array employing the present invention. First EEPROM cell 100, second EEPROM cell 110, third EEPROM cell 120, and fourth EEPROM cell 130 form a part of the EEPROM memory array. Only a portion of the memory array is shown in FIG. 3. Thus, in a 256K bit memory, there will typically be 512 columns of EEPROM memory cells, each column in turn containing 512 cells. That is, there will be 512 columns and 512 rows of cells. As would be obvious to one skilled in the art, any equivalent array technique may be used. Thus, in a 256K bit memory array, there may be 256 columns and 1024 rows of cells.

The drain of first EEPROM cell 100 is connected to first bit line 140. Likewise, the drain of second EEPROM cell 110 is connected to first bit line 140. In a typical EEPROM memory array, there will be a bit line for every column of EEPROM memory. Thus, in a 256K memory array, there will be 512 bit lines. Hence, the drain of third EEPROM cell 120 and the drain of fourth EEPROM cell 130 are both connected to second bit line 150.

The control gate of first EEPROM cell 100 is connected to first word line 160. The control gate of second EEPROM cell 110 is connected to second word line 170. In a typical EEPROM memory array, there will be a word line for every row of EEPROM memory cells in the array. Thus, in a 256K bit memory cell array, there will be 512 word lines. Hence, the control gate of third EEPROM cell 120 is connected to first word line 160, and the control gate of fourth EEPROM cell 130 is connected to second word line 170.

The source of first EEPROM cell 100 is connected to groundable mode common line 180. The source of second EEPROM cell 110 is also connected to common line 180. In a typical EEPROM memory cell array employing the present invention, there will be one common line 180 for every pair of rows of EEPROM memory cells. Thus, in a 256K bit memory cell array, there will be 256 common lines. As is shown in FIG. 3, the source of third EEPROM memory cell 120 and the source of fourth EEPROM memory cell 130 are both connected to common line 180. It will be obvious to one skilled in the art that the source of the EEPROM memory cell disclosed herein is the select transistor side of the EEPROM memory cell.

The drain of first grounding MOSFET device 190 is connected to common line 180. The source of first grounding MOSFET device 190 is connected to grounding line 210. The gate of first grounding MOSFET device 190 is connected to first word line 160. Grounding line 210 is connected to ground 220. The drain of second grounding MOSFET dvice 200 is connected to common line 180. The source of second grounding MOSFET device 200 is connected to grounding line 210. The gate of second grounding MOSFET device 200 is connected to second word line 170.

By raising the voltage applied to wordline 160, and hence to the gate of first MOSFET grounding device 190 or by raising the voltage applied to wordline 170 and hence to the gate of second MOSFET grounding device 200, the source of first EEPROM cell 100, the source of second EEPROM cell 110, the source of third EEPROM cell 120, and the source of fourth EEPROM cell 130 can be operatively connected to ground. However, by holding the gates of first MOSFET grounding device 190 and second MOSFET grounding device 200 low, the source of first EEPROM cell 100, the source of second EEPROM cell 110, the source of third EEPROM cell 120, and the source of fourth EEPROM cell 130 will be kept floating, that is not connected to ground and further not held at any fixed voltage potential. Thus, grounding means for selectively grounding the source of an EEPROM cell during programming and during reading and floating the source during erasing have been disclosed. Hence, the cell can conduct during programming and will not conduct during erasing.

Figure 4:
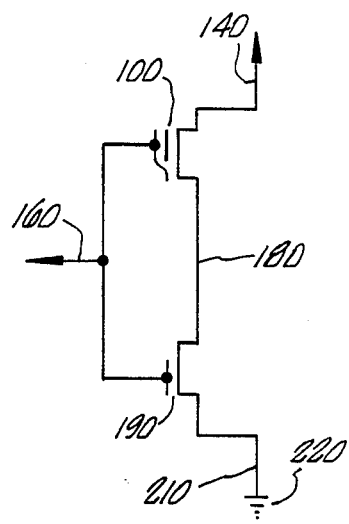
FIG. 4 shows a simplified schematic diagram of a portion of an EEPROM cell array, showing an EEPROM memory device according to the present invention with a grounding device.

FIG. 4 shows a simplified operational schematic diagram of an EEPROM memory cell device and a grounding device. The drain of first EEPROM cell 100 is connected to first bit line 140. The source of first EEPROM cell 100 is connected to common line 180. The drain of first grounding MOSFET device 190 is connected to common line 180. The source of first grounding MOSFET device 190 is operationally connected to ground 220 through grounding line 210. The control gate of first EEPROM cell 100 and the gate of first grounding MOSFET device 190 are both connected to first word line 160.

As would be obvious to one skilled in the art, there may be more than one grounding MOSFET device in each row in the array. For example, there may be one grounding MOSFET device in each row for every 16 bit lines in the array.

OPERATION OF THE PREFERRED EMBODIMENT

Each cell in an EEPROM memory array comprises a place where information can be stored. By convention, the bit of memory associated with that cell is said to be in a "0" or "1" state in binary code, depending upon whether the cell conducts or does not conduct during a read mode.

Before programming the EEPROM memory cell array, all cells are first erased. Electrically erasing a cell causes it to store positive charge on the floating gate. Hence, a cell that has been erased will conduct when tested for conduction during the read mode. In memory arrays using the presently preferred embodiment of the present invention, all cells in the EEPROM memory cell array are erased simultaneously.

In programming the EEPROM memory cell array, EEPROM memory cells which are desired to be in a binary "1" state are caused to store negative charge on the floating gate during the programming mode. It will be obvious to one skilled in the art that one of many various schemes well known in the art may be employed for determining the sequence in which cells are loaded with negative charge on the floating gate. Thus, the cells may be written one byte at a time, or in any sequence, as is well known in the art.

1. The Erase Mode

Referring to FIG. 4, when it is desired to erase an EEPROM memory cell employing the present invention, first word line 160 is grounded. First bit line 140 is raised to a potential in the range of approximately 17 to 20 volts. Thus, a high voltage difference is created between the drain and floating gate of first EEPROM cell 100. In this condition, with the high positive voltage on the drain of first EEPROM cell 100, electrons which may be stored on the floating gate of first EEPROM cell 100 are attracted to the drain of first EEPROM cell 100. As is well known in the art, electrons will then tunnel from floating gate 60 through thin dielectric region 50 into drain region 30, as shown in FIG. 1. As a result, the floating gate of first EEPROM cell 100 is discharged. Furthermore, since the gate of first grounding MOSFET device 190 is operatively connected to ground through first word line 160, first grounding MOSFET device 190 is in a nonconductive state. Hence, the source of first EEPROM cell 100 is floating. Thus, first EEPROM cell 100 will not conduct.

In the preferred embodiment of the present invention, all cells in the memory array are erased at the same time. That is, at the same time, all the word lines in the array are grounded and all the bit lines in the array are raised to the erase potential of from approximately 17 to 20 volts. Thus, all the cells in the array are erased as described above.

As shown in FIG. 2, in a second embodiment of the present invention, first gate oxide region 40 is grown uniformly thin below floating gate 60. First gate oxide region 40 may, for example, be grown to a thickness of 200 Angstroms. It would be apparent to one skilled in the art that in this second embodiment, electrons tunnel through first gate oxide region 40 when the EEPROM memory cell is being erased, in a manner equivalent to that described above.

2. The Programming Mode

When it is desired to program a binary "1" onto first EEPROM cell 100, first bit line 140 is brought to a potential of approximately 10 volts. However, as is known in the art, other voltages may be used. First word line 160 is brought to a voltage in the range of approximately 17 and 20 volts. Thus, the drain of first EEPROM cell 100 is raised to a potential of approximately 10 volts and the control gate of first EEPROM cell 100 is raised to a higher potential approximately 17 to 20 volts. Since the gate of first grounding MOSFET device 190 is held at the higher potential by first word line 160, first grounding MOSFET device 190 is in a conductive state. First grounding MOSFET device 190 therefore conducts and the source of first EEPROM cell 100 is operatively connected to ground 220 through common line 180 and first grounding MOSFET device 190. In this condition, first EEPROM cell 100 will be programmed using the hot electron injection phenomenon as is well known in the art.

Referring to FIG. 1, control gate 90 is held at from approximately 17 to 20 volts, drain region 30 is held at approximately 10 volts, and source region 20 is operatively connected to ground. Since control gate 90 is held very high, an N-channel is formed between drain region 30 and source region 20. In this condition, current in the form of negative electrons flows from source region 20 to drain region 30 through second channel 37 and first channel 35. As is disclosed in Frohman-Bentchkowsky, "FAMOS-A New Semiconductor Charge Storage Device," Solid-State Electronics, Vol. 17, p. 517 (1973), the hot-injection electron phenomenon will then cause electrons to be stored on floating gate 60. That is, some electrons flowing in first channel 35 will obtain enough momentum in the direction of floating gate 60 to pass through gate oxide region 40 under the influence of the positive attractive potential toward floating gate 60. Thus, some electrons will become deposited in floating gate 60, thereby charging floating gate 60 with negative charge.

3. The Read Mode and Operation of the Select Transistor

During the read mode, it is desired to determine whether the floating gate on the EEPROM memory cell means is charged with positive or negative charge. If the floating gate is charged with negative charge, then current will not flow through the EEPROM memory cell means during the read mode. Conversely, if the floating gate is charged with positive charge, then current will flow through the EEPROM memory cell means during the read mode.

Referring to FIG. 3, when it is desired to read first EEPROM memory cell 100, first word line 160 is raised to approximately 5 volts and first bit line 140 are raised to approximately 2 volts. All of the other word lines and all of the other bit lines in the EEPROM memory cell are grounded. Thus, second word line 170 is grounded. Since the gate of first grounding MOSFET device 190 is held at approximately 5 volts by first word line 160, first grounding MOSFET device 190 is biased to conduct, that is, first grounding MOSFET device 190 is in a conductive state. Thus, the source of first EEPROM memory cell 100 is operatively connected to ground 220 through common line 180, first grounding MOSFET device 190, and grounding line 210. The drain of first EEPROM memory cell 100 is held at approximately 2 volts by first bit line 140. Furthermore, the control gate of the select transistor portion of first EEPROM memory cell 100 is held at approximately 5 volts, therefore the select transistor of first EEPROM memory cell 100 will be in a conductive state. Hence, first EEPROM memory cell 100 will conduct, or will not conduct, depending upon the electrical charge state of the floating gate. That is, if the floating gate of first EEPROM cell 100 is charged with positive charge, then a conductive channel is formed in first channel region 35 in FIG. 1 and first EEPROM cell 100 will conduct. However, if the floating gate 60 in FIG. 1 is charged with electrons, then there is no conductive channel formed in first channel region 35 in FIG. 1 and first EEPROM cell 100 will not conduct.

It will be noted that the drain of second EEPROM cell 110 is held at approximately 2 volts by first bit line 140, and that the source of second EEPROM cell 110 is operatively connected to ground through first grounding MOSFET device 190. Thus, if the floating gate of second EEPROM cell 110 is charged with positive charge, a conductive channel in channel region 35 in FIG. 1 is formed and the MOSFET under floating gate 60 will be in a conductive state. However, control gate 90 of second EEPROM cell 110 is held low by second word line 170. Thus, there will be no conductive channel formed in second channel 37 in FIG. 1 and the select transistor of second EEPROM cell 110 will be in a nonconductive state. Hence, even though the drain of second EEPROM cell 110 is held at approximately 2 volts, the source of second EEPROM cell 110 is held low, and the floating gate of second EEPROM cell 110 is charged with positive charge, because control gate 90 which also forms the gate of the select transistor portion of second EEPROM cell 110 is held low by second word line 170, second EEPROM cell 110 will not conduct.

Thus, a block-erasable EEPROM nonvolatile semiconductor memory cell apparatus has been disclosed. Although the preferred embodiment discloses a means of constructing the apparatus using NMOS technology, it would be obvious to one skilled in the art that CMOS could be used as well.

While the foregoing has described in detail one embodiment of the present invention, it will be appreciated that, given the teachings herein, numerous equivalents and alternatives which do not depart from the present invention will be apparent to those skilled in the art, and those alternatives and equivalents are intended to be encompassed within the scope of the appended claims.

What is claimed is:

1. A block erasable electrically programmable, electrically erasable floating gate memory cell, comprising:
   a semiconductor substrate having spaced-apart source and drain regions disposed therein forming a channel therebetween,
   a floating gate, electrically insulated from said semiconductor substrate said floating gate self-aligned only with respect to said drain region and extending over a portion of said channel,
   a control gate, electrically insulated from said floating gate and from said semiconductor substrate, said control gate lying above said floating gate and being self-aligned with respect to said source and drain regions,
   whereby said floating gate memory cell may be erased by attracting electrons to said drain.

2. The block erasable electrically programable, electrically erasable floating gate memory cell of claim 1, in which:
   a portion of said dielectric region between said floating gate and said semiconductor substrate material further comprises a thin dielectric region.

3. A block erasable electrically programable, electrically erasable floating gate memory cell, comprising:
   a semiconductor substrate having spaced-apart source and drain regions disposed therein forming a channel therebetween,
   a first insulating layer overlying said substrate, said first insulating layer having a thin region adjacent to said drain region;
   a floating gate over said first insulating layer, said floating gate self-aligned only with respect to said drain region and extending over a portion of said semiconductor substrate between said drain and said source region;
   a control gate, electrically insulated from said floating gate and said substrate by a second insulating layer, said control gate lying above said floating gate and above said semiconductor substrate, said control gate self-aligned with respect to said drain region and said source region,
   whereby said floating gate memory cell may be erased by attracting electrons to said drain.

4. A block erasable electrically programable, electrically erasable floating gate memory cell, comprising:
   a semiconductor substrate having spaced-apart source and drain regions disposed therein forming a channel therebetween,
   a floating gate electrically insulated from said semiconductor substrate by a uniformly thick dielectric, said floating gate self-aligned only with respect to said drain region and extending over a portion of said semiconductor substrate between said drain region and said source region;
   a control gate, electrically insulated from said floating gate and from said semiconductor substrate said control gate lying above said floating gate and above said semiconductor substrate said control gate self-aligned with respect to said drain region and said source region,
   whereby said floating gate memory cell may be erased by attracting electrons to said drain.

5. An array of block-erasable electrically programmable electrically erasable floating gate memory cells, wherein each of said cells includes spaced apart source and drain regions disposed in a semiconductor substrate forming a channel in said substrate, a floating gate, electrically insulated from said substrate, said floating gate self-aligned only with respect to said drain region and extending over a portion of said channel, and a control gate, electrically insulated from said floating gate lying above said floating gate and being self-aligned with respect to said source and drain regions, including:
   a plurality of sets of cells, each set including a plurality of pairs of said cells, the cells in each of said pairs having their sources connected together to a groundable node, their drains connected together to a bit line, the gate of one of said cells in each pair within one of said sets being connected to a first word line and the gate of the other one of said cells in each pair within one of said set being connected to a second word line,
   a pair of first and second grounding devices for each of said sets of pairs of cells, each of said grounding devices having a drain connected to said groundable node and a source connected to ground, each of said grounding devices further having a gate, the gate of said first grounding device being connected to said first word line and the gate of said second grounding device being connected to said second word line.

6. The array of claim 5 wherein the floating gate in each of said memory cells is electrically insulated from said substrate by an insulating layer of uniform thickness.

7. The array of claim 5 wherein the floating gate in each of said memory cells is electrically insulated from said substrate by an insulating layer having a thin region in the area adjacent to said drain region of said cell.

* * * * *